United States Patent
Khlat

(10) Patent No.: US 10,529,519 B1
(45) Date of Patent: Jan. 7, 2020

(54) PASSIVE WIRELESS SWITCH CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/263,055

(22) Filed: Jan. 31, 2019

Related U.S. Application Data

(60) Provisional application No. 62/727,881, filed on Sep. 6, 2018.

(51) Int. Cl.
    *H01H 59/00* (2006.01)
    *H03H 9/02* (2006.01)
    *H03H 9/15* (2006.01)

(52) U.S. Cl.
    CPC .... *H01H 59/0009* (2013.01); *H03H 9/02007* (2013.01); *H03H 9/02244* (2013.01); *H03H 9/15* (2013.01)

(58) Field of Classification Search
    CPC .................................................. H01H 59/0009
    See application file for complete search history.

(56) References Cited

U.S. PATENT DOCUMENTS

| 7,732,977 B2 | 6/2010 | Martin et al. |
| 2015/0381163 A1 | 12/2015 | Green et al. |

FOREIGN PATENT DOCUMENTS

WO    WO-2015160723 A1 * 10/2015 ............... B81B 7/02

OTHER PUBLICATIONS

Notice of Allowance for U.S. Appl. No. 16/263,069, dated Jun. 12, 2019, 8 pages.

* cited by examiner

*Primary Examiner* — Daniel J Cavallari
(74) *Attorney, Agent, or Firm* — Withrow & Terranova, P.L.L.C.

(57) ABSTRACT

A passive wireless switch circuit and related apparatus are provided. In examples discussed herein, the passive wireless switch circuit includes a microelectromechanical systems (MEMS) switch(es) configured to be closed when receiving a constant voltage(s) that exceeds a defined threshold voltage (e.g., 30-50 V). The passive wireless switch circuit is configured to convert a radio frequency (RF) voltage(s), which may be harvested from an RF signal(s) received via an antenna(s) in a selected frequency bandwidth(s), into the constant voltage higher than the defined threshold voltage to close the MEMS switch(es). As such, it may be possible to eliminate active components and/or circuits from the passive wireless switch circuit, thus helping to reduce leakage and power consumption. As a result, it may be possible to provide the passive wireless switch circuit in a low power apparatus for supporting such applications as the Internet-of-Things (IoT).

20 Claims, 8 Drawing Sheets

PASSIVE WIRELESS SWITCH CIRCUIT AND RELATED APPARATUS

RELATED APPLICATIONS

This application claims the benefit of U.S. provisional patent application Ser. No. 62/727,881, filed on Sep. 6, 2018, the disclosure of which is incorporated herein by reference in its entirety.

This application is related to U.S. patent application Ser. No. 16/263,069, filed Jan. 31, 2019, entitled "PASSIVE WIRELESS SWITCH CIRCUIT AND RELATED APPARATUS," the disclosure of which is hereby incorporated herein by reference in its entirety.

FIELD OF THE DISCLOSURE

The technology of the disclosure relates generally to operating microelectromechanical systems (MEMS) switches in an electrical circuit.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Notably, a conventional switch, such as a silicon-on-insulator (SOI) switch, may create a relatively higher on-resistance ($R_{ON}$) when the conventional switch is closed and a relatively higher off-capacitance ($C_{OFF}$) when the conventional switch is opened. Accordingly, the conventional switch may suffer a degraded figure-of-merit (FOM) (FOM=$R_{ON} \times C_{OFF}$) and cause unwanted insertion loss to degrade RF efficiency and/or performance of the wireless device. In contrast, a microelectromechanical systems (MEMS) switch typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the wireless device.

SUMMARY

Aspects disclosed in the detailed description include a passive wireless switch circuit and related apparatus. In examples discussed herein, the passive wireless switch circuit includes a microelectromechanical systems (MEMS) switch(es) configured to be closed when receiving a constant voltage(s) that exceeds a defined threshold voltage (e.g., 30-50 V). The passive wireless switch circuit is configured to convert a radio frequency (RF) voltage(s), which may be harvested from an RF signal(s) received via an antenna(s) in a selected frequency bandwidth(s), into the constant voltage higher than the defined threshold voltage to close the MEMS switch(es). As such, it may be possible to eliminate active components and/or circuits from the passive wireless switch circuit, thus helping to reduce leakage and power consumption. As a result, it may be possible to provide the passive wireless switch circuit in a low power apparatus for supporting such applications as the Internet-of-Things (IoT).

In one aspect, a passive wireless switch circuit is provided. The passive wireless switch circuit includes a voltage circuit. The voltage circuit includes an antenna port coupled to an antenna configured to absorb an RF signal in a selected frequency bandwidth and corresponding to an RF voltage. The voltage circuit also includes a bulk acoustic wave (BAW) structure coupled to the antenna port. The BAW structure is configured to resonate at the selected frequency bandwidth to convert the RF voltage to a boosted RF voltage higher than the RF voltage. The voltage circuit also includes a rectifier circuit coupled to the BAW structure. The rectifier circuit is configured to generate a constant voltage based on the boosted RF voltage. The passive wireless switch circuit also includes a MEMS switch having a gate terminal coupled to the rectifier circuit. The MEMS switch is configured to be closed in response to the constant voltage received via the gate terminal exceeding a defined threshold voltage.

In another aspect, an apparatus is provided. The apparatus includes a first circuit. The apparatus also includes a second circuit. The apparatus also includes a passive wireless switch circuit coupled between the first circuit and the second circuit. The passive wireless switch circuit includes a voltage circuit. The voltage circuit includes an antenna port coupled to an antenna configured to absorb an RF signal in a selected frequency bandwidth and corresponding to an RF voltage. The voltage circuit also includes a bulk acoustic wave (BAW) structure coupled to the antenna port. The BAW structure is configured to resonate at the selected frequency bandwidth to convert the RF voltage to a boosted RF voltage higher than the RF voltage. The voltage circuit also includes a rectifier circuit coupled to the BAW structure. The rectifier circuit is configured to generate a constant voltage based on the boosted RF voltage. The passive wireless switch circuit also includes a MEMS switch having a gate terminal coupled to the rectifier circuit. The MEMS switch is configured to be closed to couple the first circuit to the second circuit in response to the constant voltage received via the gate terminal exceeding a defined threshold voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1B:
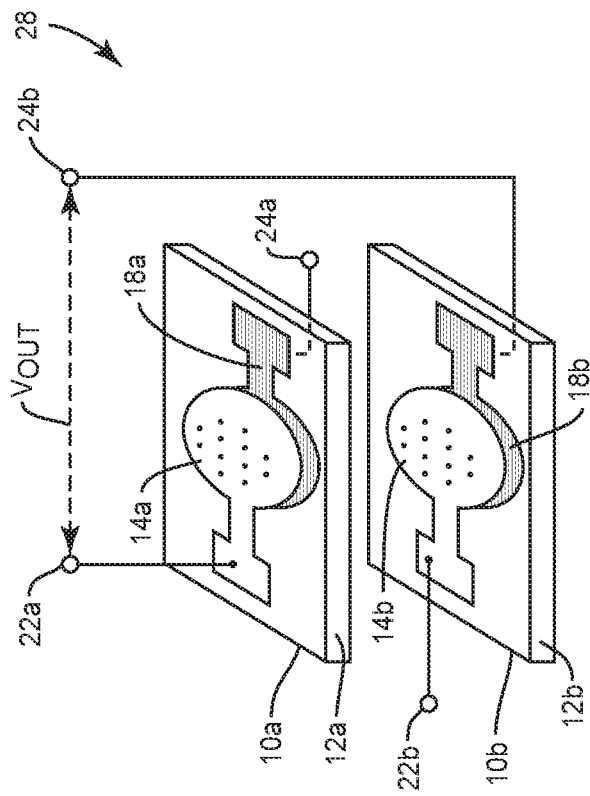
FIG. 1B is a schematic diagram of an exemplary BAW structure, which may be formed based on the BAW device of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a passive wireless switch circuit and related apparatus. In examples discussed herein, the passive wireless switch circuit includes a microelectromechanical systems (MEMS) switch(es) configured to be closed when receiving a constant voltage(s) that exceeds a defined threshold voltage (e.g., 30-50 V). The passive wireless switch circuit is configured to convert a radio frequency (RF) voltage(s), which may be harvested from an RF signal(s) received via an antenna(s) in a selected frequency bandwidth(s), into the constant voltage higher than the defined threshold voltage to close the MEMS switch(es). As such, it may be possible to eliminate active components and/or circuits from the passive wireless switch circuit, thus helping to reduce leakage and power consumption. As a result, it may be possible to provide the passive wireless switch circuit in a low power apparatus for supporting such applications as the Internet-of-Things (IoT).

Figure 1A:
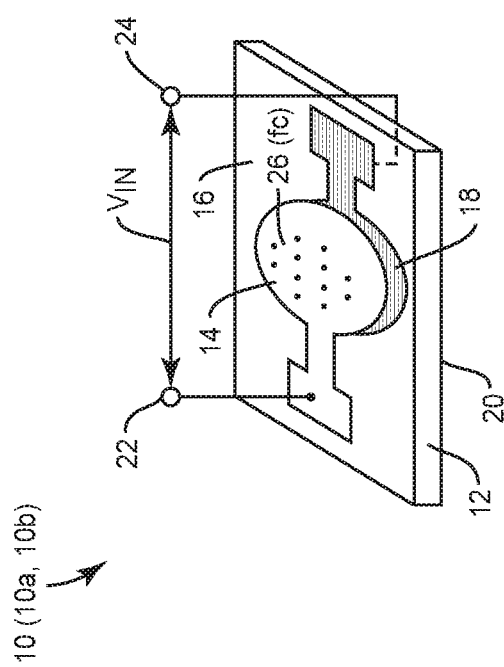
FIG. 1A is a schematic diagram of an exemplary bulk acoustic wave (BAW) device.

Before discussing a passive wireless switch circuit of the present disclosure, a brief overview of a bulk acoustic wave (BAW) structure, which may multiply an RF voltage to generate a boosted RF voltage higher than the RF voltage is first provided with reference to FIGS. 1A and 1B. The discussion of specific exemplary aspects of the passive wireless switch circuit and related apparatuses of the present disclosure starts below with reference to FIG. 2.

In this regard, FIG. 1A is a schematic diagram of an exemplary BAW device 10 (e.g., a BAW filter). The BAW device 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a voltage $V_{IN}$ is applied between a top electrical port 22 and a bottom electrical port 24, an acoustic wave 26 is excited and resonates at a resonance frequency $f_C$ between the top surface 16 and the bottom surface 20 of the piezo layer 12. The resonance frequency $f_C$ may be determined by a thickness of the piezo layer 12 as well as a mass of the top metal electrode 14 and the bottom metal electrode 18.

The BAW device 10 may be configured to expand the piezo layer 12 when a positive voltage $V_{IN}$ is applied between top electrical port 22 and the bottom electrical port 24 and compress the piezo layer 12 when a negative voltage $V_{IN}$ is applied between top electrical port 22 and the bottom electrical port 24. Hereinafter, the BAW device 10 in which the piezo layer 12 expands and compresses respectively in response to the positive voltage $V_{IN}$ and the negative voltage $V_{IN}$ is referred to as a polarized BAW device 10a.

Alternatively, the BAW device 10 may be configured to compress the piezo layer 12 when the positive voltage $V_{IN}$ is applied between top electrical port 22 and the bottom electrical port 24 and expand the piezo layer 12 when the negative voltage $V_{IN}$ is applied between top electrical port 22 and the bottom electrical port 24. Hereinafter, the BAW device 10 in which the piezo layer 12 compresses and expands respectively in response to the positive voltage $V_{IN}$ and the negative voltage $V_{IN}$ is referred to as a polarized inverted BAW device 10b.

FIG. 1B is a schematic diagram of an exemplary BAW structure 28, which may be formed based on the polarized BAW device 10a (e.g., a polarized BAW filter) and the polarized inverted BAW device 10b (e.g., a polarized inverted BAW filter) of FIG. 1A. Common elements between FIGS. 1A and 1B are shown therein with common element numbers and will not be re-described herein.

The polarized BAW device 10a includes a piezo layer 12a (e.g., a quartz crystal), a top metal electrode 14a, and a bottom metal electrode 18a that correspond to the piezo layer 12, the top metal electrode 14, and the bottom metal electrode 18 of FIG. 1A, respectively. The polarized inverted BAW device 10b includes a piezo layer 12b (e.g., a quartz crystal), a top metal electrode 14b, and a bottom metal electrode 18b that correspond to the piezo layer 12, the top metal electrode 14, and the bottom metal electrode 18 of FIG. 1A, respectively. In a non-limiting example, the polarized BAW device 10a is stacked on top of the polarized inverted BAW device 10b. In this regard, the bottom metal electrode 18a of the polarized BAW device 10a is coupled to the top metal electrode 14b of the polarized inverted BAW device 10b.

When the positive voltage $V_{IN}$ is applied between the top metal electrode 14a and the bottom metal electrode 18a, the piezo layer 12a expands. Concurrently, when the positive voltage $V_{IN}$ is applied between the top metal electrode 14b and the bottom metal electrode 18b, the piezo layer 12b compresses. As a result, a voltage $V_{OUT}$ between the top metal electrode 14a and the bottom metal electrode 18b equals two times the voltage $V_{IN}$ ($V_{OUT}=2\times V_{IN}$). In this regard, the BAW structure 28 can be said to function as a voltage multiplier. Accordingly, by interleaving an equal number of the polarized BAW device 10a and the polarized inverted BAW device 1b in a BAW structure, it may be possible to multiply the voltage $V_{IN}$ to generate the voltage $V_{OUT}$ based on the equation (Eq. 1) below.

$$V_{OUT}=N_L \times V_{IN} \qquad \text{(Eq. 1)}$$

In the equation (Eq. 1) above, $N_L$ represents a total number of the polarized BAW device 10a and the polarized inverted BAW device 10b in the BAW structure 28. For example, if the BAW structure 28 is configured to include five (5) polarized BAW devices 10a that interleave with 5 polarized inverted BAW devices 10b, the BAW structure 28 is able to generate the voltage $V_{OUT}$ that equals ten (10) times the voltage $V_{IN}$ ($V_{OUT}=10\times V_{IN}$). As discussed below, the BAW structure 28 may be provided in a passive wireless switch circuit to generate a boosted RF voltage (e.g., $V_{OUT}$) based on an RF voltage (e.g., $V_{IN}$) for controlling a MEMS switch(es).

Figure 2:
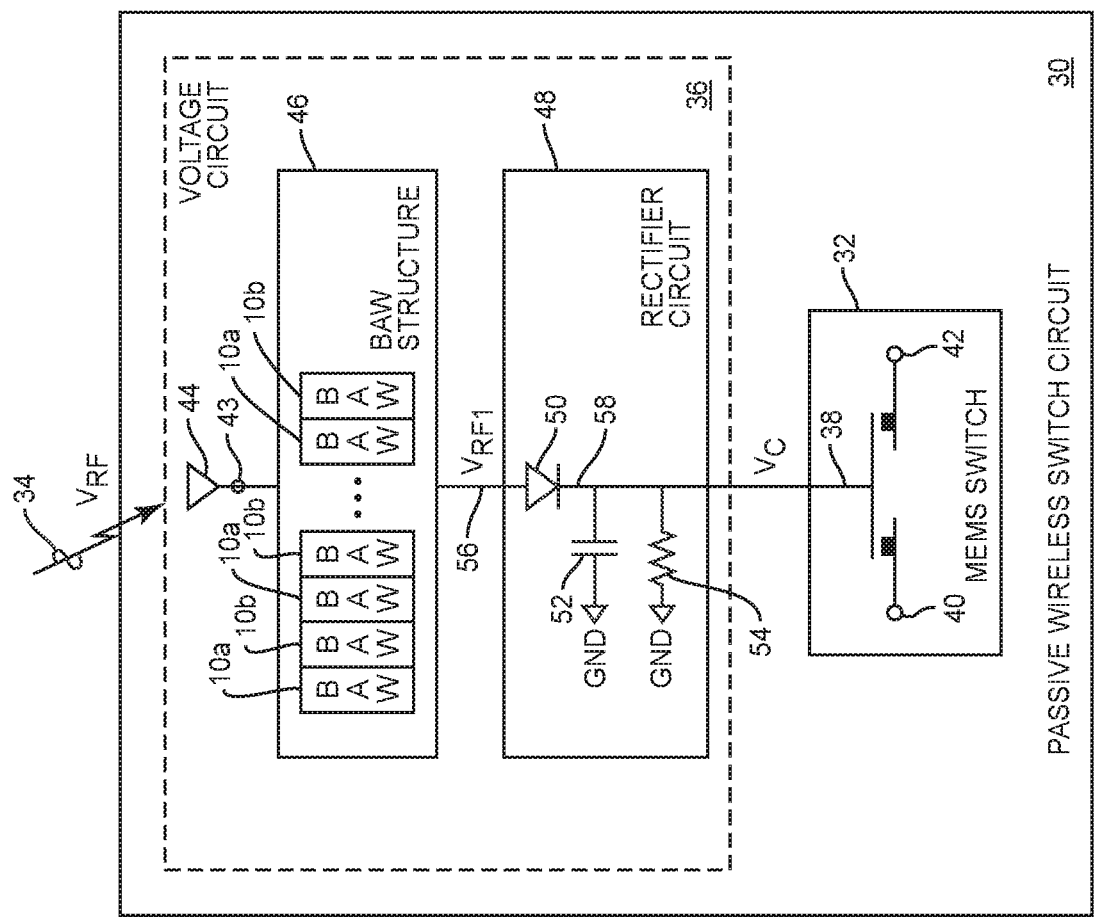
FIG. 2 is a schematic diagram of an exemplary passive wireless switch circuit configured according to an embodiment of the present disclosure to control at least one microelectromechanical systems (MEMS) switch by harvesting a radio frequency (RF) voltage from an RF signal.

FIG. 2 is a schematic diagram of an exemplary passive wireless switch circuit 30 configured according to an embodiment of the present disclosure to control at least one MEMS switch 32 by harvesting an RF voltage $V_{RF}$ from an RF signal 34. As discussed in detail below, the passive wireless switch circuit 30 can be configured to multiply the RF voltage $V_{RF}$ to generate a boosted RF voltage $V_{RF1}$, which is higher than the RF voltage $V_{RF}$, and subsequently generate a constant voltage $V_C$ based on the boosted RF voltage $V_{RF1}$ to operate (close or open) the MEMS switch 32. In this regard, there will be no electrical current in the passive wireless switch circuit 30 until the RF signal 34 is received. As such, the passive wireless switch circuit 30 has very little leakage in absence of the RF signal 34, thus making it possible to provide the passive wireless switch circuit 30 in a low power apparatus (e.g., a battery-operated electronic device) for supporting such applications as the Internet-of-Things (IoT).

The passive wireless switch circuit 30 includes at least one voltage circuit 36 configured to generate the constant voltage $V_C$ based on the RF voltage $V_{RF}$. The MEMS switch 32 includes a gate terminal 38 that is coupled to the voltage circuit 36 to receive the constant voltage $V_C$. When the constant voltage $V_C$ exceeds (higher than or equal to) a defined threshold voltage (e.g., 30-50 V), the MEMS switch 32 is closed to allow an electrical current to flow from a drain terminal 40 to a source terminal 42, or vice versa. In contrast, when the constant voltage $V_C$ is below the defined threshold voltage, the MEMS switch 32 is opened, thus stopping the electrical current between the drain terminal 40 and the source terminal 42.

The voltage circuit 36 includes at least one antenna port 43 configured to be coupled to at least one antenna 44. The antenna 44 is configured to absorb the RF signal 34 in a selected frequency bandwidth. Herein, the phrase "frequency bandwidth" refers to a continuous RF band centered at a center frequency bounded by a lower frequency (lower than the center frequency) and an upper frequency (higher than the center frequency). Although the antenna 44 is shown to be inside the voltage circuit 36, it should be appreciated that the antenna 44 may also be provided outside the voltage circuit 36 and coupled to the voltage circuit 36 via the antenna port 43.

The voltage circuit 36 includes at least one BAW structure 46 configured to multiply the RF voltage $V_{RF}$ to generate the boosted RF voltage $V_{RF1}$. In a non-limiting example, the BAW structure 46 is identical to the BAW structure 28 of FIG. 1B. In this regard, the BAW structure 46 may include an equal number of polarized BAW devices 10a (e.g., polarized BAW filters) and polarized inverted BAW devices 10b (e.g., polarized inverted BAW filters). The polarized BAW devices 10a are configured to interleave with the polarized inverted BAW devices 10b.

The BAW structure 46 may be so configured to pass the RF signal 34 in the selected frequency bandwidth, while rejecting the RF signal 34 outside the selected frequency bandwidth. As such, the passive wireless switch circuit 30 can be configured to respond only if the RF signal 34 falls within the selected frequency bandwidth. In this regard, the RF signal 34 can be considered as being "absent" with respect to the passive wireless switch circuit 30 when the RF signal 34 falls outside the frequency bandwidth, regardless of whether the RF signal 34 actually exists. Like the BAW structure 28 of FIG. 1B, the BAW structure 46 is configured to multiply the RF voltage $V_{RF}$ to generate the boosted RF voltage $V_{RF1}$ in accordance to the equation (Eq. 1) above.

The voltage circuit 36 includes a rectifier circuit 48 configured to convert the boosted RF voltage $V_{RF1}$ to the constant voltage $V_C$. In a non-limiting example, the rectifier circuit 48 includes a diode 50, a holding capacitor 52, and a pull-down resistor 54. The diode 50 includes an anode node 56 coupled to the BAW structure 46 and a cathode node 58 coupled to the gate terminal 38. The holding capacitor 52 is coupled between the cathode node 58 and a ground (denoted as GND). The pull-down resistor 54 is coupled in parallel to the holding capacitor 52 between the cathode node 58 and the GND. In a non-limiting example, the pull-down resistor 54 is configured to pull the constant voltage $V_C$ to below the defined threshold voltage (e.g., the GND), thus keeping the MEMS switch 32 open, in absence of the RF signal 34.

The passive wireless switch circuit 30 can be configured in accordance to a variety of topologies, which are described next in reference to FIGS. 3A-3C. Common elements between FIGS. 2 and 3A-3C are shown therein with common element numbers and will not be re-described herein.

Figure 3A:
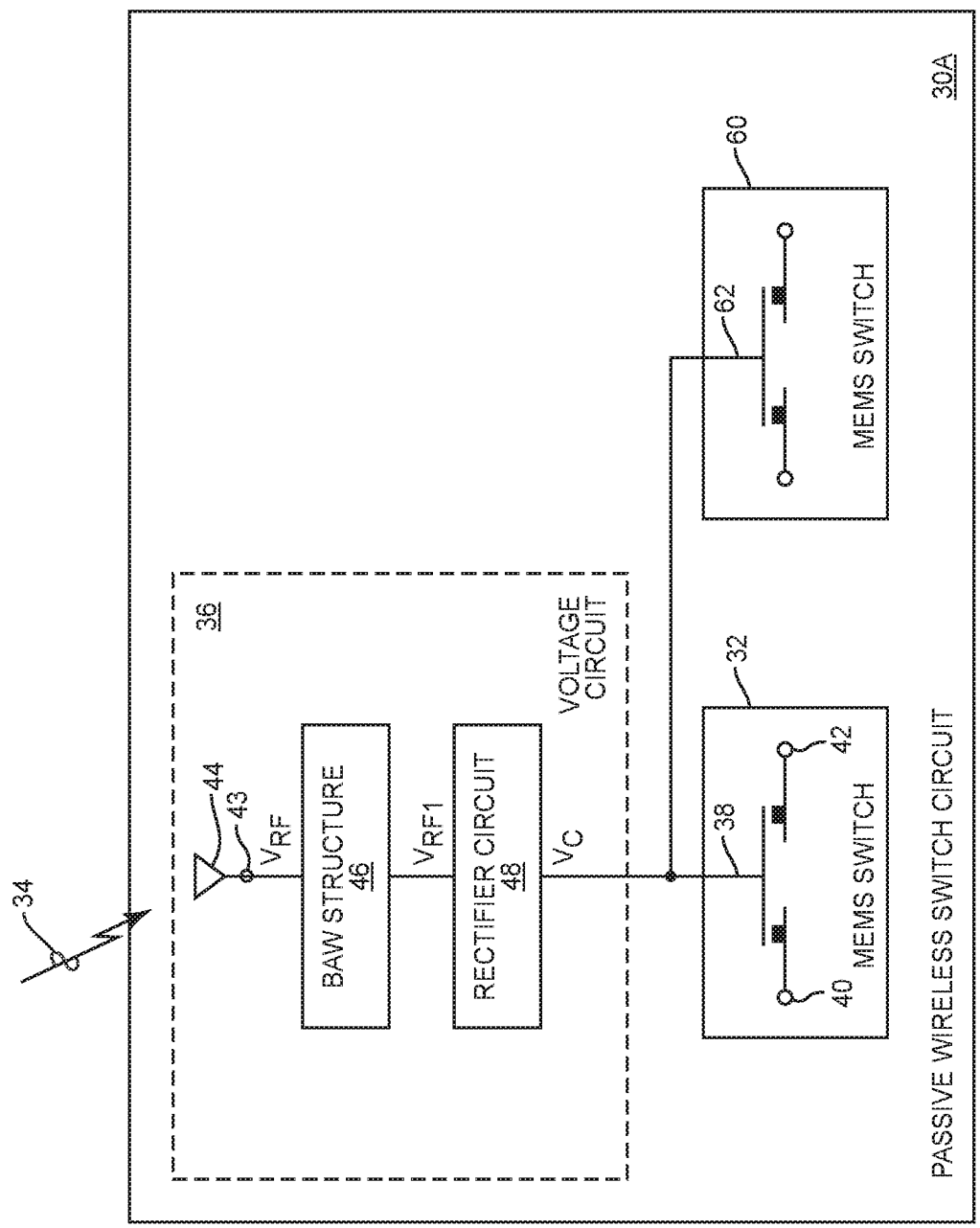
FIG. 3A is a schematic diagram of an exemplary passive wireless switch circuit in which multiple MEMS switches are controlled by a single voltage circuit.

FIG. 3A is a schematic diagram of an exemplary passive wireless switch circuit 30A in which multiple MEMS switches are controlled by a single voltage circuit, such as the voltage circuit 36 of FIG. 2. The passive wireless switch circuit 30A includes at least one second MEMS switch 60 having at least one second gate terminal 62 coupled to the rectifier circuit 48 to receive the constant voltage $V_C$. Like the MEMS switch 32, the second MEMS switch 60 is configured to be closed when the constant voltage $V_C$ exceeds the defined threshold voltage and opened when the constant voltage $V_C$ is below the defined threshold voltage. In this regard, both the MEMS switch 32 and the second MEMS switch 60 can be closed or opened concurrently based on presence or absence of the RF signal 34.

Figure 3B:
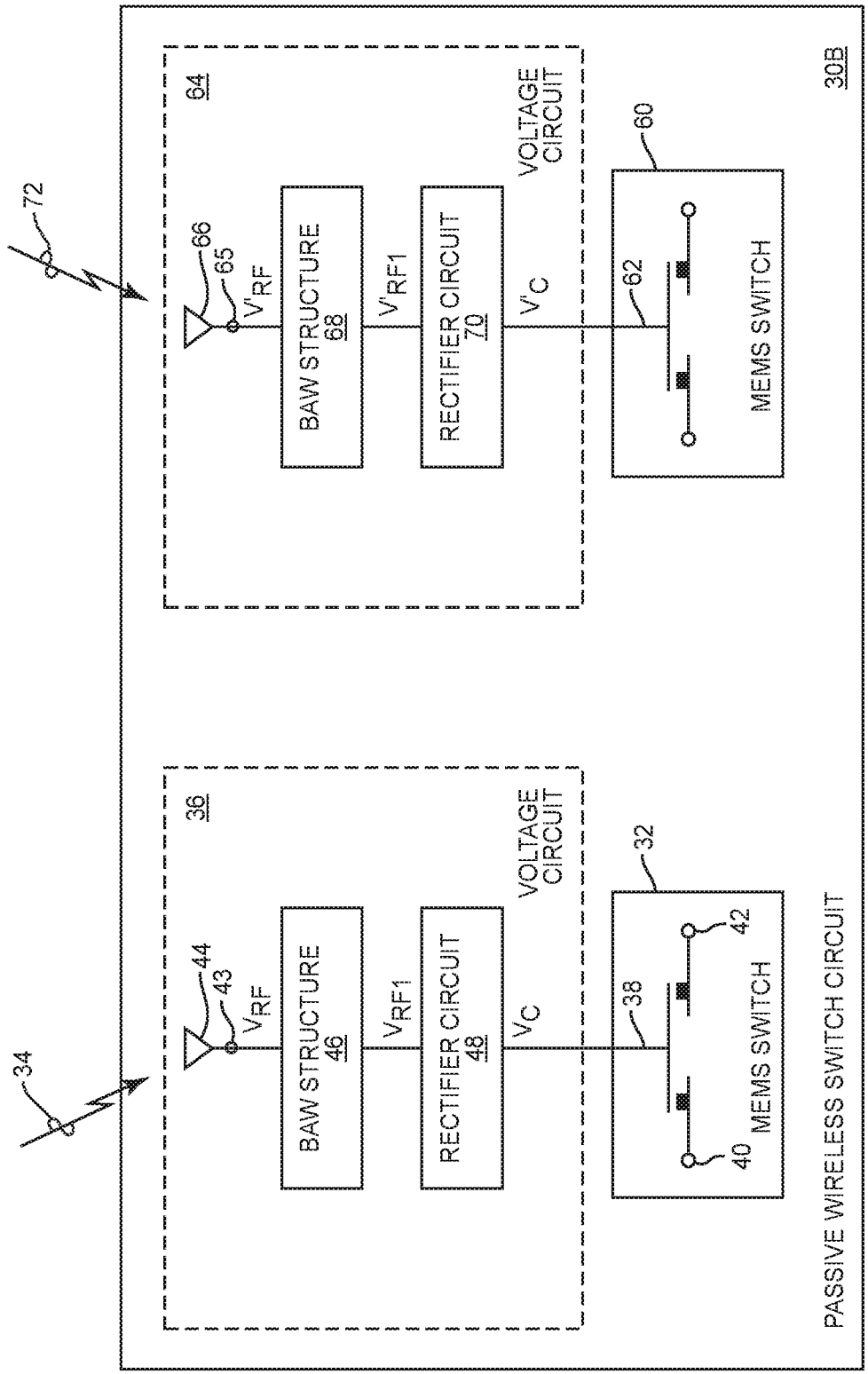
FIG. 3B is a schematic diagram of an exemplary passive wireless switch circuit in which multiple MEMS switches are controlled by multiple voltage circuits, respectively.
Figure 3C:
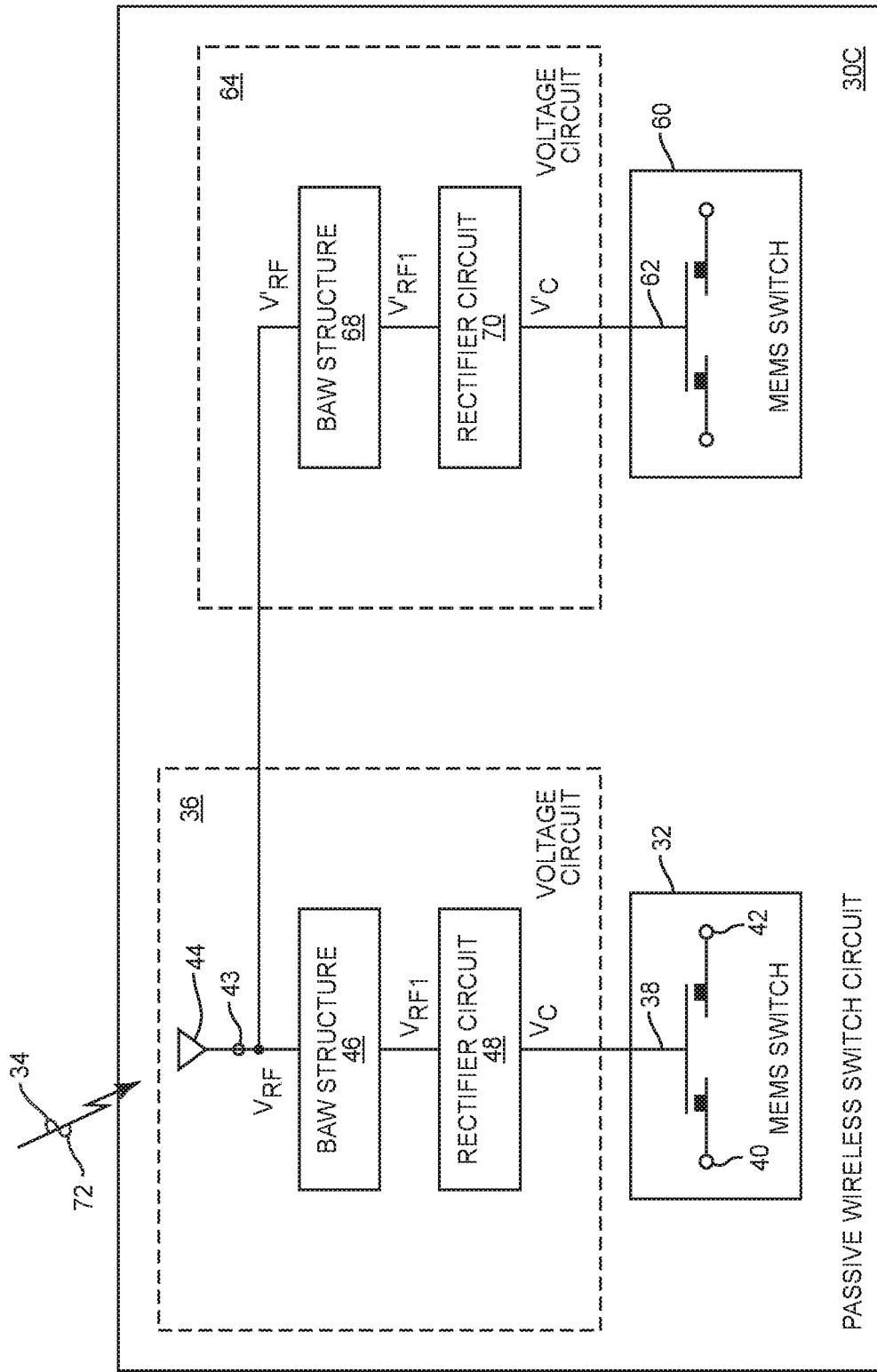
FIG. 3C is a schematic diagram of an exemplary passive wireless switch circuit in which multiple MEMS switches are controlled respectively by multiple voltage circuits sharing a common antenna.

FIG. 3B is a schematic diagram of an exemplary passive wireless switch circuit 30B in which multiple MEMS switches are controlled respectively by multiple voltage circuits, such as the voltage circuit 36 of FIG. 2. The passive wireless switch circuit 30B includes at least one second voltage circuit 64, which is functionally equivalent to the voltage circuit 36. For example, the second voltage circuit 64 includes at least one second antenna port 65 configured to be coupled to at least one second antenna 66. The second voltage circuit 64 also includes at least one second BAW structure 68, and at least one second rectifier circuit 70. The second antenna port 65, the second BAW structure 68, and the second rectifier circuit 70 are functionally equivalent to the antenna port 43, the BAW structure 46, and the rectifier circuit 48, respectively.

In this regard, the second antenna 66 is configured to absorb at least one second RF signal 72 in at least one second selected frequency bandwidth and corresponds to at least one second RF voltage $V'_{RF}$. The second BAW structure 68 is configured to multiply the second RF voltage $V'_{RF}$ to generate at least one second boosted RF voltage $V'_{RF1}$. The second rectifier circuit 70 is configured to generate at least one second constant voltage $V'_C$ based on the second boosted RF voltage $V'_{RF1}$.

Notably, the RF signal 34 and the second RF signal 72 are communicated respectively in the selected frequency bandwidth and the second selected frequency bandwidth that do not overlap with each other, the RF signal 34 and the second RF signal 72 can be concurrently provided to the passive wireless switch circuit 30B to concurrently close the MEMS switch 32 and the second MEMS switch 60 with little interference. Alternatively, it is possible to close the MEMS switch 32 or the second MEMS switch 60 individually by communicating the RF signal 34 or the second RF signal 72 to the passive wireless switch circuit 30B.

FIG. 3C is a schematic diagram of an exemplary passive wireless switch circuit 30C in which multiple MEMS switches are controlled respectively by multiple voltage circuits, such as the voltage circuit 36 of FIG. 2, sharing a common antenna, such as the antenna 44 of FIG. 2. By sharing the antenna 44 between the voltage circuit 36 and the second voltage circuit 64, it may be possible to close the MEMS switch 32 and the second MEMS switch 60 either individually or concurrently.

In one non-limiting example, the MEMS switch 32 and the second MEMS switch 60 can be configured to be controlled based on the presence of the RF signal 34 in the selected frequency bandwidth and the second RF signal 72 in the second selected frequency bandwidth non-overlapping with the selected frequency bandwidth. In this regard, the RF signal 34 and the second RF signal 72 may be communicated based on a time-division duplex (TDD) scheme. Accordingly, it is only possible to close the MEMS switch 32 or the second MEMS switch 60 at a given time.

In another non-limiting example, the MEMS switch 32 and the second MEMS switch 60 can be configured to be controlled based on the presence of the RF signal 34 in the selected frequency bandwidth and the second RF signal 72 in the second selected frequency bandwidth that is at least partially overlapping with the selected frequency bandwidth. In this regard, it may be possible to concurrently close the MEMS switch 32 and the second MEMS switch 60 in the passive wireless switch circuit 30C.

Figure 4A:
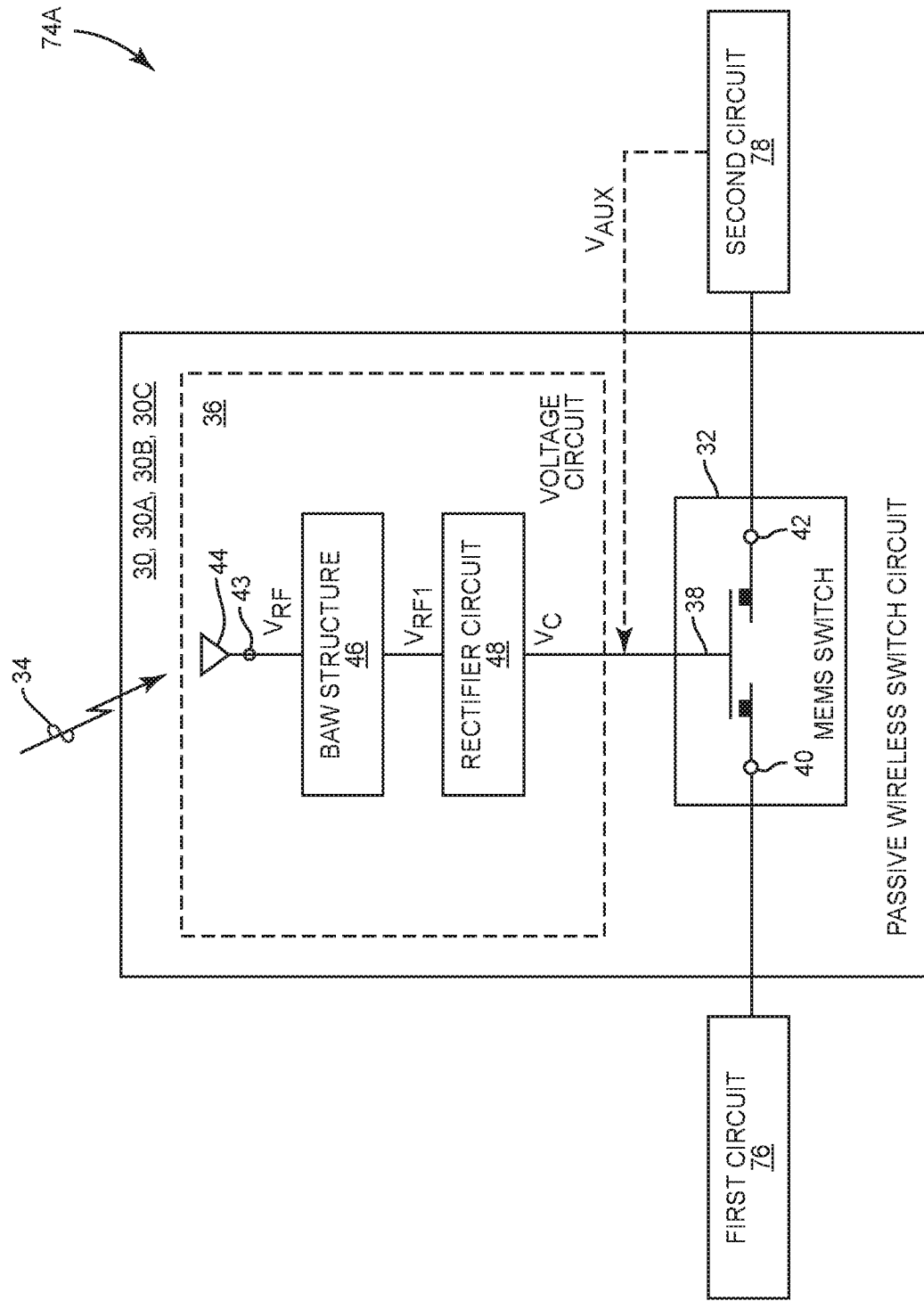
FIG. 4A is a schematic diagram of an exemplary apparatus including the passive wireless switch circuit of FIG. 2, the passive wireless switch circuit of FIG. 3A, the passive wireless switch circuit of FIG. 3B, or the passive wireless switch circuit of FIG. 3C for coupling/decoupling a first circuit and a second circuit.

The passive wireless switch circuit 30 of FIG. 2, the passive wireless switch circuit 30A of FIG. 3A, the passive wireless switch circuit 30B of FIG. 3B, and the passive wireless switch circuit 30C of FIG. 3C, can be provided in an apparatus to support a variety of applications. In this regard, FIG. 4A is a schematic diagram of an exemplary apparatus 74A including the passive wireless switch circuit 30 of FIG. 2, the passive wireless switch circuit 30A of FIG. 3A, the passive wireless switch circuit 30B of FIG. 3B, or the passive wireless switch circuit 30C of FIG. 3C for coupling/decoupling a first circuit 76 and a second circuit 78. Although only the passive wireless switch circuit 30 is illustrated in the apparatus 74, it should be appreciated that the operations discussed herein can be enabled by the passive wireless switch circuits 30A-30C as well.

According to previous discussions in FIG. 2, the MEMS switch 32 can be closed to couple the first circuit 76 to the second circuit 78 and opened to decouple the first circuit 76 from the second circuit 78. The second circuit 78 may be activated or deactivated in response to being coupled or decoupled from the first circuit 76. When activated, the second circuit 78 may provide an auxiliary constant voltage $V_{AUX}$ to the gate terminal 38. More specifically, the second circuit 78 may provide the auxiliary constant voltage $V_{AUX}$ exceeding the defined threshold voltage to keep the MEMS switch 32 closed for a defined duration. With the auxiliary constant voltage $V_{AUX}$, it may be possible to shorten the duration in which the RF signal 34 is present.

In one non-limiting example, the first circuit 76 is an antenna tuner circuit and the second circuit 78 is an antenna circuit configured to be tuned by the antenna tuner circuit. In this regard, the passive wireless switch circuit 30 can be configured to tune the antenna circuit by coupling the antenna tuner circuit to the antenna circuit.

In another non-limiting example, the first circuit 76 is a battery circuit configured to generate a battery voltage and the second circuit 78 is an IoT circuit (e.g., wireless sensor circuitry) configured to be activated in response to receiving the battery voltage. In this regard, the passive wireless switch circuit 30 can be configured to activate the IoT circuit by coupling the battery circuit to the IoT circuit or deactivate the IoT circuit by decoupling the battery circuit from the IoT circuit.

Figure 4B:
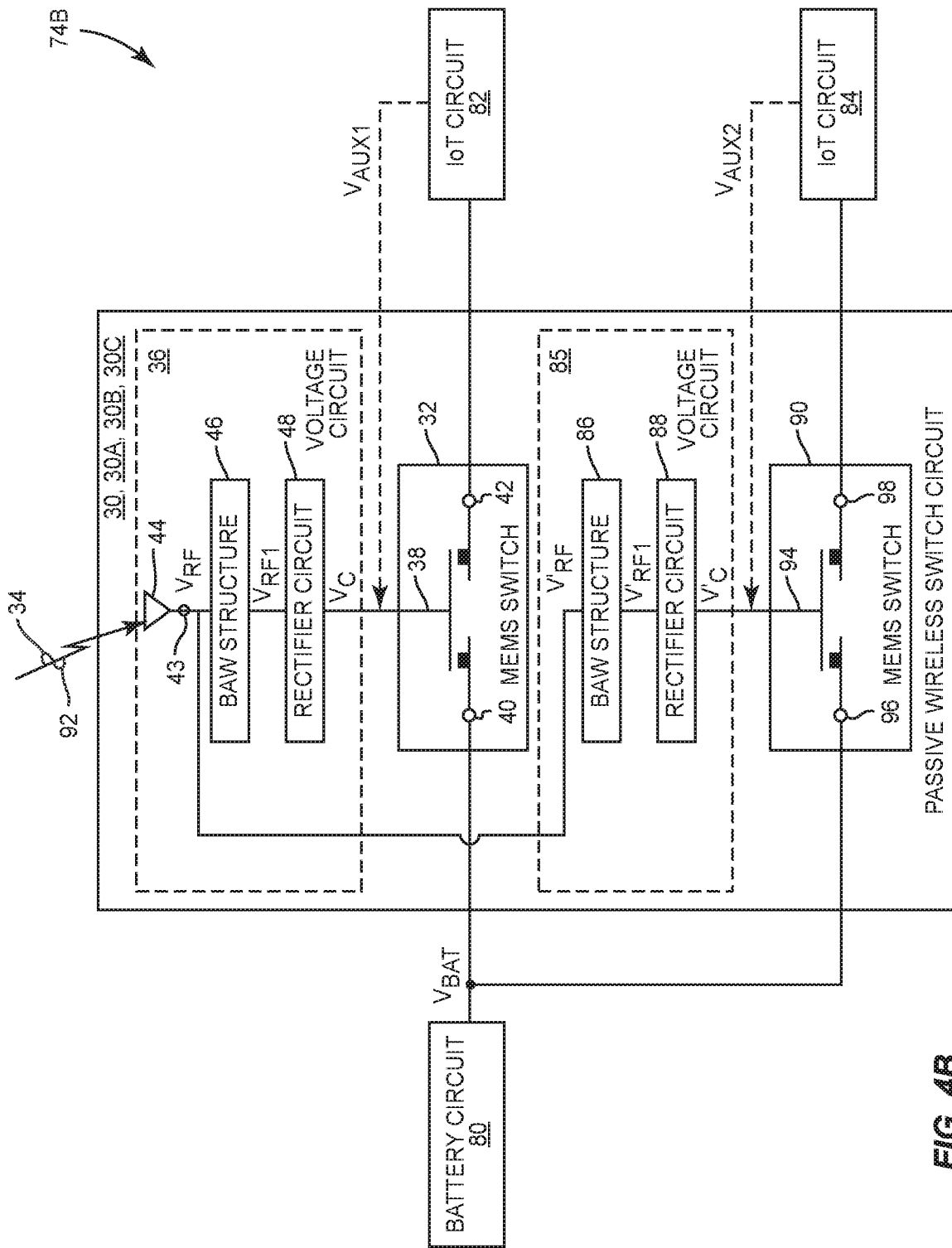
FIG. 4B is a schematic diagram of an exemplary apparatus in which the passive wireless switch circuit of FIG. 2, the passive wireless switch circuit of FIG. 3A, the passive wireless switch circuit of FIG. 3B, or the passive wireless switch circuit of FIG. 3C can be adapted to control multiple Internet-of-Things (IoT) circuits.

FIG. 4B is a schematic diagram of an exemplary apparatus 74B in which the passive wireless switch circuit 30 of FIG. 2, the passive wireless switch circuit 30A of FIG. 3A, the passive wireless switch circuit 30B of FIG. 3B, or the passive wireless switch circuit 30C of FIG. 3C can be adapted to control multiple IoT circuits. Common elements between FIGS. 4A and 4B are shown therein with common element numbers and will not be re-described herein.

The apparatus 74B includes a battery circuit 80, which may be identical to the first circuit 76 of FIG. 4A, an IoT circuit 82, which may be the same as the second circuit 78 of FIG. 4A, and a second IoT circuit 84. The battery circuit 80 is configured to generate a battery voltage $V_{BAT}$. The IoT circuit 82 and the second IoT circuit 84 are each configured to be activated in response to receive the battery voltage $V_{BAT}$ and deactivated in response to losing the battery voltage $V_{BAT}$. The voltage circuit 36 is coupled between the battery circuit 80 and the IoT circuit 82. In this regard, the MEMS switch 32 is configured to couple the battery circuit 80 to the IoT circuit 82 or decouple the battery circuit 80 from the IoT circuit 82 based on the presence or absence of the RF signal 34. When activated, the IoT circuit 82 may be configured to provide a first auxiliary constant voltage $V_{AUX1}$ to the gate terminal 38 to keep the MEMS switch 32 closed for a first defined duration.

The apparatus 74B includes a second voltage circuit 85, which includes a second BAW structure 86, a second rectifier circuit 88, and a second MEMS switch 90 that are functionally equivalent to the BAW structure 46, the rectifier circuit 48, and the MEMS switch 32, respectively. The antenna port 43 may be configured to receive a second RF signal 92 via the antenna 44 in a second selected frequency bandwidth and corresponds to a second RF voltage $V'_{RF}$. In one non-limiting example, the second selected frequency bandwidth is non-overlapping with the selected frequency bandwidth of the RF signal 34. As such, the antenna port 43 may be configured to alternate between receiving the RF signal 34 in the selected frequency bandwidth and the second RF signal 92 in the second selected frequency bandwidth based on a TDD scheme. In another non-limiting example, the second selected frequency bandwidth is at least partially overlapping with the selected frequency bandwidth of the RF signal 34. As such, the antenna port 43 may be configured to concurrently receive the RF signal 34 in the selected frequency bandwidth and the second RF signal 92 in the second selected frequency bandwidth, thus allowing the IoT circuit 82 and the second IoT circuit 84 to be closed concurrently.

The second BAW structure 86 is coupled to the antenna port 43 and configured to convert the second RF voltage $V'_{RF}$ to a second boosted RF voltage $V'_{RF1}$ higher than the second RF voltage $V'_{RF}$. The second rectifier circuit 88 is coupled to the second BAW structure 86 and configured to generate a second constant voltage $V'_C$ based on the second boosted RF voltage $V'_{RF1}$. The second MEMS switch 90 has a second gate terminal 94 coupled to the second rectifier circuit 88, a second drain terminal 96 coupled to the battery circuit 80, and a second source terminal 98 coupled to the second IoT circuit 84. The second MEMS switch 90 is closed to couple the battery circuit 80 to the second IoT circuit 84 in response to the second constant voltage $V'_C$ exceeding the defined threshold voltage. When activated, the second IoT circuit 84 may be configured to provide a second auxiliary constant voltage $V_{AUX2}$ to the second gate terminal 94 to keep the second MEMS switch 90 closed for a second defined duration.

Figure 5:
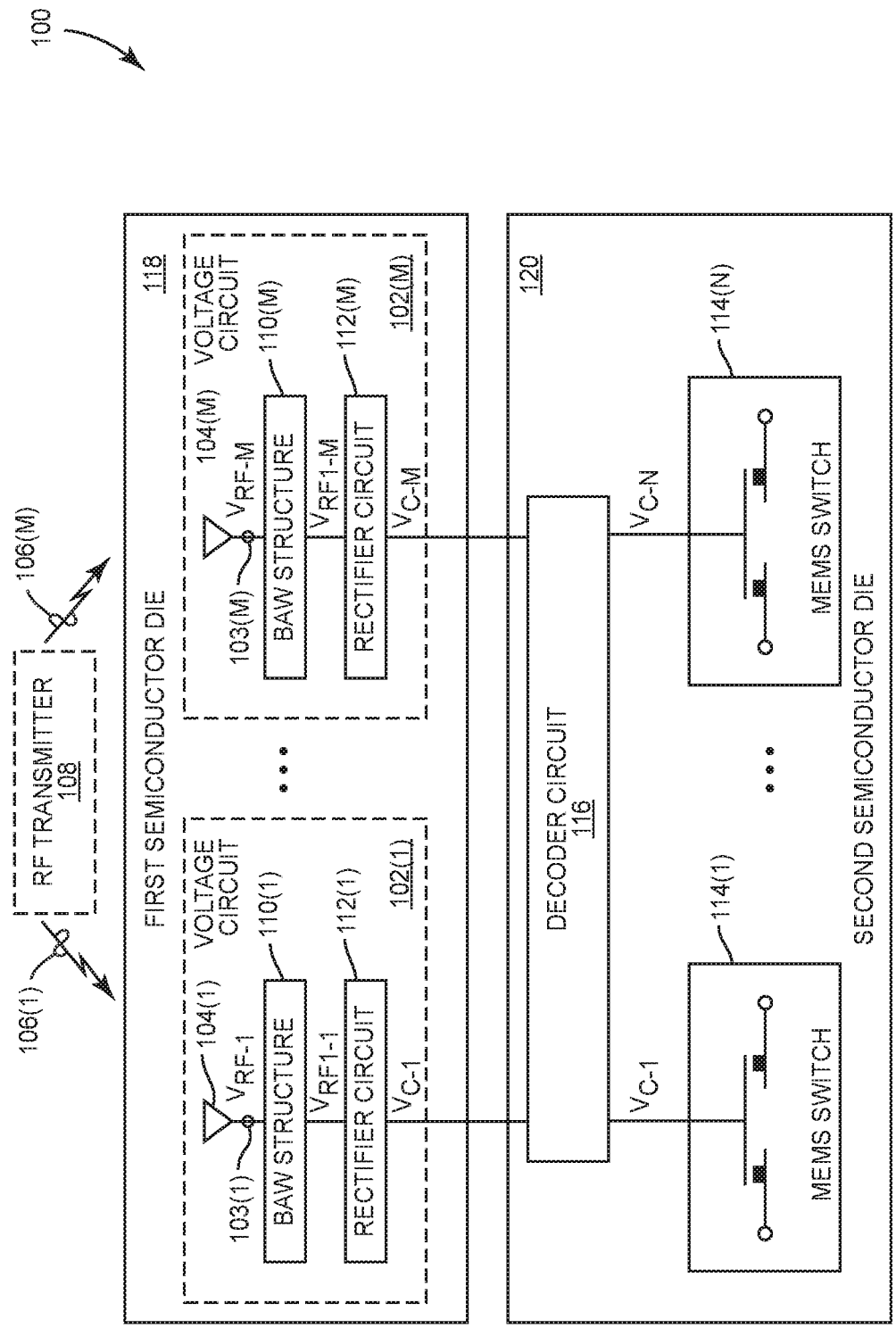
FIG. 5 is a schematic diagram of an exemplary apparatus configured according to an embodiment of the present disclosure to control a larger number of MEMS switches based on a smaller number of voltage circuits.

In a non-limiting example, it is possible to control a larger number of MEMS switches based on a smaller number of voltage circuits. In this regard, FIG. 5 is a schematic diagram of an exemplary apparatus 100 configured according to an embodiment of the present disclosure to control a larger number of MEMS switches, such as the MEMS switch 32 of FIG. 2, based on a smaller number of voltage circuits, such as the voltage circuit 36 of FIG. 2.

The apparatus 100 includes a first number of voltage circuits 102(1)-102(M), each may be functionally equivalent to the voltage circuit 36 of FIG. 2. The voltage circuits 102(1)-102(M) include a first number of antenna ports 103(1)-103(M) coupled to a first number of antennas 104(1)-104(M), respectively. The antennas 104(1)-104(M) are configured to absorb a first number of RF signals 106(1)-106(M), respectively. Notably, the antennas 104(1)-104(M) may be integrated with the voltage circuits 102(1)-102(M) or separated from the voltage circuits 102(1)-102(M), respectively. The RF signals 106(1)-106(M) may be transmitted from an RF transmitter 108 in a first number of selected frequency bandwidths and correspond to a first number of RF voltages $V_{RF-1}$-$V_{RF-M}$, respectively. The selected frequency bandwidths may be configured to not overlap with each other to help reduce potential interferences among the RF signals 106(1)-106(M).

The voltage circuits 102(1)-102(M) include a first number of BAW structures 110(1)-110(M), each may be functionally equivalent to the BAW structure 46 of FIG. 2. In this regard, the BAW structures 110(1)-110(M) are configured to generate a first number of boosted RF voltages $V_{RF1-1}$-$V_{RF1-M}$ based on the RF voltages $V_{RF-1}$-$V_{RF-M}$.

The voltage circuits 102(1)-102(M) include a first number of rectifier circuits 112(1)-112(M), each may be functionally equivalent to the rectifier circuit 48 of FIG. 2. In this regard, the rectifier circuits 112(1)-112(M) are configured to generate a first number of constant voltages $V_{C-1}$-$V_{C-M}$ based on the boosted RF voltages $V_{RF1-1}$-$V_{RF1-M}$.

The apparatus 100 includes a second number of MEMS switches 114(1)-114(N) (N>M), each may be functionally equivalent to the MEMS switch 32 of FIG. 2. In this regard, the MEMS switches 114(1)-114(N) are configured to be closed respectively in response to receiving a second number of constant voltages $V_{C-1}$-$V_{C-N}$ exceeding the defined threshold voltage.

Notably, the second number N is greater than the first number M. As such, to support a larger number of the MEMS switches 114(1)-114(N) based on a smaller number of the voltage circuits 102(1)-102(M), a decoder circuit 116 is provided between the voltage circuits 102(1)-102(M) and the MEMS switches 114(1)-114(N). In one non-limiting example, the constant voltages $V_{C-1}$-$V_{C-M}$ can be so generated to collectively represent a second number of binary codewords that uniquely identify the MEMS switches 114(1)-114(N), respectively. In this regard, the relationship between the first number M and the second number N may be expressed in the equation (Eq. 2) below.

$$2^M \geq N \qquad \text{(Eq. 2)}$$

The decoder circuit 116 may be configured to receive the constant voltages $V_{C-1}$-$V_{C-M}$ from the voltage circuits 102(1)-102(M), respectively. The constant voltages $V_{C-1}$-$V_{C-M}$ may be so generated to uniquely identify a selected MEMS switch among the MEMS switches 114(1)-114(N). For example, if only the constant voltage $V_{C-1}$ exceeds the defined threshold voltage while the constant voltages $V_{C-2}$-$V_{C-M}$ are below the defined threshold voltage, then the selected MEMS switch collectively identified by the constant voltages $V_{C-1}$-$V_{C-M}$ can be the MEMS switch 114(1) among the MEMS switches 114(1)-114(N).

The decoder circuit 116 may include a second number of decoders (not shown) configured to decode the second number of binary codewords, respectively. Please refer to U.S. patent application Ser. No. 16/243,367, entitled "MICROELECTROMECHANICAL SYSTEMS (MEMS) SWITCHING CIRCUIT AND RELATED APPARATUS," filed on Jan. 9, 2019, for examples of the binary codewords configured to uniquely identify the MEMS switches 114(1)-114(N) and an exemplary implementation of the decoder circuit 116. In this regard, the decoder circuit 116 is configured to decode the constant voltages $V_{C-1}$-$V_{C-M}$ to determine the selected MEMS switch among the MEMS switches 114(1)-114(N). Accordingly, the decoder circuit 116 may provide the constant voltage $V_{C-1}$ to the selected MEMS switch 114(1).

The apparatus 100 may include a first semiconductor die 118 and a second semiconductor die 120 that are separate from each other. In a non-limiting example, the voltage circuits 102(1)-102(M) can be provided in the first semiconductor die 118, while the decoder circuit 116 and the MEMS switches 114(1)-114(N) are provided in the second semiconductor die 120.

Those skilled in the art will recognize improvements and modifications to the embodiments of the present disclosure. All such improvements and modifications are considered within the scope of the concepts disclosed herein and the claims that follow.

What is claimed is:

1. A passive wireless switch circuit comprising:
    a voltage circuit comprising:
        an antenna port coupled to an antenna configured to absorb a radio frequency (RF) signal in a selected frequency bandwidth and corresponding to an RF voltage;
        a bulk acoustic wave (BAW) structure coupled to the antenna port and configured to resonate at the selected frequency bandwidth to convert the RF voltage to a boosted RF voltage higher than the RF voltage; and
        a rectifier circuit coupled to the BAW structure and configured to generate a constant voltage based on the boosted RF voltage; and
    a microelectromechanical systems (MEMS) switch having a gate terminal coupled to the rectifier circuit and configured to be closed in response to the constant voltage received via the gate terminal exceeding a defined threshold voltage.

2. The passive wireless switch circuit of claim 1 wherein the MEMS switch is further configured to be opened in response to the constant voltage received via the gate terminal being below the defined threshold voltage.

3. The passive wireless switch circuit of claim 1 wherein the BAW structure comprises a plurality of polarized BAW devices interleaving with a plurality of polarized inverted BAW devices, the BAW structure is configured to generate the boosted RF voltage corresponding to the RF voltage multiplied by a sum of the plurality of polarized BAW devices and the plurality of polarized inverted BAW devices.

4. The passive wireless switch circuit of claim 1 wherein the rectifier circuit comprises:
    a diode having an anode coupled to the BAW structure and a cathode node coupled to the gate terminal; and
    a holding capacitor coupled between the cathode node and a ground.

5. The passive wireless switch circuit of claim 4 wherein the rectifier circuit further comprises a pull-down resistor coupled in parallel to the holding capacitor between the cathode node and the ground and configured to pull the constant voltage down to the ground in response to the antenna not absorbing the RF signal in the selected frequency bandwidth.

6. The passive wireless switch circuit of claim 1 further comprising at least one second MEMS switch having at least one second gate terminal coupled to the rectifier circuit and configured to be closed in response to the constant voltage received via the gate terminal exceeding the defined threshold voltage.

7. The passive wireless switch circuit of claim 1 further comprising:
    a second voltage circuit comprising:
        a second antenna port coupled to a second antenna configured to absorb a second RF signal in a second selected frequency bandwidth and corresponding to a second RF voltage;
        a second BAW structure coupled to the second antenna port and configured to resonate at the second selected frequency bandwidth to convert the second RF voltage to a second boosted RF voltage higher than the second RF voltage; and
        a second rectifier circuit coupled to the second BAW structure and configured to generate a second constant voltage based on the second boosted RF voltage; and
    a second MEMS switch having a second gate terminal coupled to the second rectifier circuit and configured to be closed in response to the second constant voltage received via the second gate terminal exceeding the defined threshold voltage.

8. The passive wireless switch circuit of claim 1 wherein the antenna port is further configured to receive a second RF signal in a second selected frequency bandwidth and corresponding to a second RF voltage.

9. The passive wireless switch circuit of claim 8 further comprising:
    a second BAW structure coupled to the antenna port and configured to convert the second RF voltage to a second boosted RF voltage higher than the second RF voltage;
    a second rectifier circuit coupled to the second BAW structure and configured to generate a second constant voltage based on the second boosted RF voltage; and
    a second MEMS switch having a second gate terminal coupled to the second rectifier circuit and configured to be closed in response to the second constant voltage received via the second gate terminal exceeding the defined threshold voltage.

10. An apparatus comprising:
    a first circuit;
    a second circuit; and
    a passive wireless switch circuit coupled between the first circuit and the second circuit and comprising:

a voltage circuit comprising:

an antenna port coupled to an antenna configured to absorb a radio frequency (RF) signal in a selected frequency bandwidth and corresponding to an RF voltage;

a bulk acoustic wave (BAW) structure coupled to the antenna port and configured to resonate at the selected frequency bandwidth to convert the RF voltage to a boosted RF voltage higher than the RF voltage;

a rectifier circuit coupled to the BAW structure and configured to generate a constant voltage based on the boosted RF voltage; and a microelectromechanical systems (MEMS) switch having a gate terminal coupled to the rectifier circuit and configured to be closed to couple the first circuit to the second circuit in response to the constant voltage received via the gate terminal exceeding a defined threshold voltage.

11. The apparatus of claim 10 wherein the MEMS switch is further configured to be opened to decouple the first circuit from the second circuit in response to the constant voltage received via the gate terminal being below the defined threshold voltage.

12. The apparatus of claim 10 wherein the BAW structure comprises a plurality of polarized BAW devices interleaving with a plurality of polarized inverted BAW devices, the BAW structure is configured to generate the boosted RF voltage corresponding to the RF voltage multiplied by a sum of the plurality of polarized BAW devices and the plurality of polarized inverted BAW devices.

13. The apparatus of claim 10 wherein the rectifier circuit comprises:

a diode having an anode coupled to the BAW structure and a cathode node coupled to the gate terminal;

a holding capacitor coupled between the cathode node and a ground; and a pull-down resistor coupled in parallel to the holding capacitor between the cathode node and the ground and configured to pull the constant voltage down to the ground in response to the antenna not absorbing the RF signal in the selected frequency bandwidth.

14. The apparatus of claim 10 wherein the second circuit is further configured to provide an auxiliary constant voltage greater than or equal to the defined threshold voltage to the gate terminal to keep the MEMS switch closed for a defined duration after the MEMS switch is activated by the constant voltage.

15. The apparatus of claim 10 wherein:

the first circuit comprises a battery circuit configured to generate a battery voltage;

the second circuit comprises an Internet-of-Things (IoT) circuit configured to be activated in response to receiving the battery voltage; and the MEMS switch is further configured to be closed to couple the battery circuit to the IoT circuit in response to the constant voltage received via the gate terminal exceeding the defined threshold voltage.

16. The apparatus of claim 15 wherein the IoT circuit is further configured to be deactivated in response to being decoupled from the battery circuit.

17. The apparatus of claim 15 wherein the antenna port is further configured to receive a second RF signal in a second selected frequency bandwidth and corresponding to a second RF voltage.

18. The apparatus of claim 17 further comprising:

a second IoT circuit configured to be activated in response to receiving the battery voltage;

a second BAW structure coupled to the antenna port and configured to resonate at the second selected frequency bandwidth to convert the second RF voltage to a second boosted RF voltage higher than the second RF voltage;

a second rectifier circuit coupled to the second BAW structure and configured to generate a second constant voltage based on the second boosted RF voltage; and a second MEMS switch having a second gate terminal coupled to the second rectifier circuit and configured to be closed to couple the battery circuit to the second IoT circuit in response to the second constant voltage received via the second gate terminal exceeding the defined threshold voltage.

19. The apparatus of claim 18 wherein:

the IoT circuit is further configured to provide a first auxiliary constant voltage greater than or equal to the defined threshold voltage to the gate terminal to keep the MEMS switch closed for a first defined duration after the MEMS switch is activated by the constant voltage; and the second IoT circuit is further configured to provide a second auxiliary constant voltage greater than or equal to the defined threshold voltage to the second gate terminal to keep the second MEMS switch closed for a second defined duration after the second MEMS switch is activated by the second constant voltage.

20. The apparatus of claim 10 wherein:

the first circuit comprises an antenna tuner circuit;

the second circuit comprises an antenna circuit configured to be tuned by the antenna tuner circuit; and the MEMS switch is further configured to be closed to couple the antenna tuner circuit to the antenna circuit in response to the constant voltage received via the gate terminal exceeding the defined threshold voltage.

* * * * *